US006651213B2

(12) United States Patent
Hassner et al.

(10) Patent No.: US 6,651,213 B2
(45) Date of Patent: Nov. 18, 2003

(54) PROGRAMMABLE MULTI-LEVEL TRACK LAYOUT METHOD AND SYSTEM FOR OPTIMIZING ECC REDUNDANCY IN DATA STORAGE DEVICES

(75) Inventors: Martin Aureliano Hassner, Mountain View, CA (US); Bernd Lamberts, Cupertino, CA (US); Thomas Earl Stanley, Gilroy, CA (US)

(73) Assignee: International Business Machines Corporation, Armonk, NY (US)

( * ) Notice: Subject to any disclaimer, the term of this patent is extended or adjusted under 35 U.S.C. 154(b) by 407 days.

(21) Appl. No.: 09/811,882

(22) Filed: Mar. 19, 2001

(65) Prior Publication Data

US 2002/0178421 A1 Nov. 28, 2002

(51) Int. Cl.7 .......................... G11C 29/00; H03M 13/00
(52) U.S. Cl. ........................................ 714/763; 714/781
(58) Field of Search ................................ 714/763, 777, 714/781, 782, 783, 784, 787, 788, 761, 762, 755; 708/530

(56) References Cited

U.S. PATENT DOCUMENTS

| 5,068,858 A | | 11/1991 | Blaum et al. ................. 371/41 |
| 5,377,207 A | * | 12/1994 | Perlman ...................... 714/784 |
| 5,487,077 A | | 1/1996 | Hassner et al. ............. 371/40.1 |
| 5,946,328 A | | 8/1999 | Cox et al. ................. 371/37.11 |
| 6,085,349 A | * | 7/2000 | Stein ........................... 714/778 |
| 6,578,170 B1 | * | 6/2003 | Piret et al. ................... 714/758 |

OTHER PUBLICATIONS

P. Delarte, "Four Fundamental Parameters of a Code and Their Combinational Significance," Information and Control 23, 407–438 (1973).
M. Hassner et al., "Exponential Series Statistical Modeling of Track Misregistration Noise in Magnetic Storage Channels," 1992.

I. Area et al., "Minimal recurrence relations for connection coefficients between classical orthogonal polynomials: Discrete case," Journal of Computational and Applied Mathematics 89, 315 (1998).
Levi et al., "Symmetries and Integrability of Difference Equations," CRM Proceedings & Lecture Notes vol. 9, 319 (1998).
A. Ronveaux et al., "Recurrence Relation Approach for Connection Coefficients. Applications to Classical Discrete Orthogonal Polynomials," CRM Proceedings & Lecture Notes vol. 9, 1996.
P. Delsarte, "An Algebraic Approach to the Association Schemes of Coding Theory," Philips Res. Repts Suppl. pp. 38–39, 1973, No. 10.

* cited by examiner

Primary Examiner—Christine T. Tu
(74) Attorney, Agent, or Firm—Samuel A. Kassatly

(57) ABSTRACT

A method for adaptively controlling the error correction redundancy is presented. The method utilizes test information collected at the file characterization test to adaptively determine the quantity of error correction code bytes needed at a multitude of levels of the error correction scheme. The error correction needed at the sub-block level is determined from a measurement of the back ground noise floor. At the block level the file characterization is specific to zones identified by head, disk, sector and cylinder. The formatting efficiency of the drive is increased by adaptively linking the length of the error correction code to the location of the zone. By measuring the error rate (E/R) on a per zone basis and comparing this rate to the disk level E/R the ECC can be optimized on a per-zone basis. The method is implemented by modeling a probability distribution as a first polynomial having a basis, converting the first polynomial to a second polynomial having a different basis, and by defining a Hamming distance distribution from the second polynomial. In a preferred embodiment, modeling the probability distribution includes modeling as a Charlier polynomial, and converting to the second polynomial includes converting to a Krawtchouck polynomial, and using connection coefficients that are calculated recursively.

14 Claims, 7 Drawing Sheets

FROM 660 (FIG. 6A)

665

$$P_n^{(q)} = \sum_{\nu=0}^{n} (-q)^\nu (q-1)^{n-\nu} \binom{N-\nu}{n-\nu}\binom{x}{\nu}$$

$$P_n^{(q)}(x;N) = \sum_{m=0}^{n} c_m(n) C_m^{(a)}(x)$$

$$(n-m+1)c_{m-1}(n) + m(q + a(2m-n-N-1))c_m(n) +$$
$$a^2 m(m+1)(N-m)c_{m+1}(n) = 0$$

where Cn+1(n) = 0, Cn(n) = 1

$$\alpha(x) = \sum_{i=0}^{n} \alpha_i P_i^{(q)}(x)$$

$$\alpha(x) = M \prod_{i=1}^{n} (1 - \frac{x}{d_i})$$

PROGRAMMABLE MULTI-LEVEL TRACK LAYOUT METHOD AND SYSTEM FOR OPTIMIZING ECC REDUNDANCY IN DATA STORAGE DEVICES

FIELD OF THE INVENTION

The present invention relates to the field of data storage, and particularly to error correction code systems that use multi-level code structures for detecting and correcting disk drive read/write errors. More specifically, the present invention relates to a programmable multi-level track layout algorithm for optimizing error correction redundancy.

BACKGROUND OF THE INVENTION

The operation of magnetic storage devices such as disk drives, relies on the ability of the device to write and read data in the form of an electromagnetic signals with high precision. In the normal operation of magnetic storage devices it is possible for mechanical, thermal, or electrical events to occur that may interfere with the required precision. An Error Correction Code system is used to detect and correct errors due to undesirable events and to ensure the integrity of the stored data. As the magnetic storage areal densities are increased to the 100 Gbit/in$^2$ level and beyond, the electromagnetic signal may be increasingly corrupted by random noise, and errors may result due to background noise.

Traditionally, the error correcting systems used is an On-The-Fly Reed Solomon (RS) code. Data is stored in 512 byte sectors, commonly split into a number of interleaves, each of which is independently protected by an equal number of check bytes of a Reed-Solomon code, stored on the disk. A Reed-Solomon code is a linear cyclic code having the structure of a block code.

To date, the number of bytes used by the error correcting code has been uniformly distributed. Often the number of bytes used for error correction either exceeds the number actually required, or is insufficient for the actual errors occurring non-uniformly across the disk surface, since the number of bytes used for correction is determined by the error rate as recorded across the entire surface. The bytes themselves consume valuable disk real estate.

There is therefore a need for an adaptive error correction code (ECC) method that reduces the number of check bytes as well as ensures data integrity when affected by a mixture of long error bursts as well as random error caused by background noise. The desired method should increase the storage capacity of the disk by reducing the area devoted to ECC. Currently, approximately five percent (5%) of the total disk storage area is devoted to the ECC.

During an exemplary manufacturing process, the disk drives could be tested at the drive operating level. Part of this test would require information to be written to and read from at least some sectors. The strength and quality of the magnetic read back signal is monitored and recorded. This information is descriptive of the ability of the drives to accurately read and write bytes and can be used to characterize areas of the magnetic disks that have a higher likelihood to generate errors.

Hassner, et al., U.S. Pat. No. 5,487,077 describes a location dependent variable error correction process for multi-track recording media using variable length coding means. The programmable multi-level error correction code has the capability of adjusting to the linear recording density of a zone of contiguous recording tracks on a surface or volume having at least two zones of different average linear recording density. Each zone has associated therewith a parameter d, the Hamming distance, d, defining the number of error correction bytes (r=d−1) to be appended to data blocks to form a codeword written to tracks within the zone and the number t less than or equal to $\lfloor (d-1)/2 \rfloor$ of correctable errors in the event of a non-zero syndrome vector calculated upon readback of a codeword from a track within the zone. The d parameter determines the length of a shift register type encoder/syndrome generator.

Blaum et. al., U.S. Pat. No. 5,068,858, proposes a method for error correction encoding and decoding of sequences (blocks) of data symbols (bytes) using a linear cyclic code such that the number of check symbols (bytes) appending each data block could be reduced as a function of the band or zone of contiguous concentric tracks. The result in the Blaum et al. patent was based on the observation that for conventional recording the linear recording track density varies as an inverse function of the radius moving from the disk center to circumference. As a consequence, the errors tend to be clustered in the dense inner zones of tracks. This implies that the number of error correction bytes appending each block could be progressively reduced where the blocks were recorded on the less dense outer zones. An alternative to reducing the number of ECC bytes per block is to reduce the codeword size.

Though conventional methods may have resolved certain problems, there remains a need for a multi-level, adaptive ECC format to be used in blocks comprised of several 512-byte sectors, where check bytes are uniformly appended to the inner 512 byte sub-blocks and non-uniformly to the larger blocks, and are used in an efficient manner to control error correction redundancy.

SUMMARY OF THE INVENTION

The present invention utilizes test information collected at the file characterization test to adaptively determine the quantity of error correction code bytes needed at all levels of the error correction scheme. The error correction needed at the sector level is determined from a measurement of the background noise floor.

At the block level the file characterization is specific to zones identified by a head, sectors and cylinders. The formatting efficiency of the drive is increased by adaptively linking the length of the error correction code to the location of the zone. By measuring the error rate on a per zone basis and comparing this rate to the disk level error rate the ECC can be optimized on a per-zone basis. One zone is comprised of approximately 500 tracks and there are typically 20 to 30 zones per disk.

To this end, the present invention describes an algorithm for calculating a programmable multi-level ECC scheme by modeling a probability distribution as a first polynomial having a basis, converting the first polynomial to a second polynomial having a different basis, and defining a Hamming distance distribution from the second polynomial.

In a preferred embodiment, modeling the probability distribution includes modeling as a Charlier polynomial, and converting to the second polynomial includes converting to a Krawtchouck polynomial, and using connection coefficients that are calculated recursively. The optimization of error correction redundancy in a data storage medium is implemented by assigning additional check bytes, and by defining the Hamming distance distribution according to the following expression:

$$\{t_1, [B_k, t_k]\},$$

where k varies between 2 and a predefined value n; where $B_k$ denotes a number of sub-blocks, and where $t_k$ represents an additional number of corrections given to this number of sub-blocks.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items.

DETAILED DESCRIPTION OF THE PREFERRED EMBODIMENTS

Figure 1:
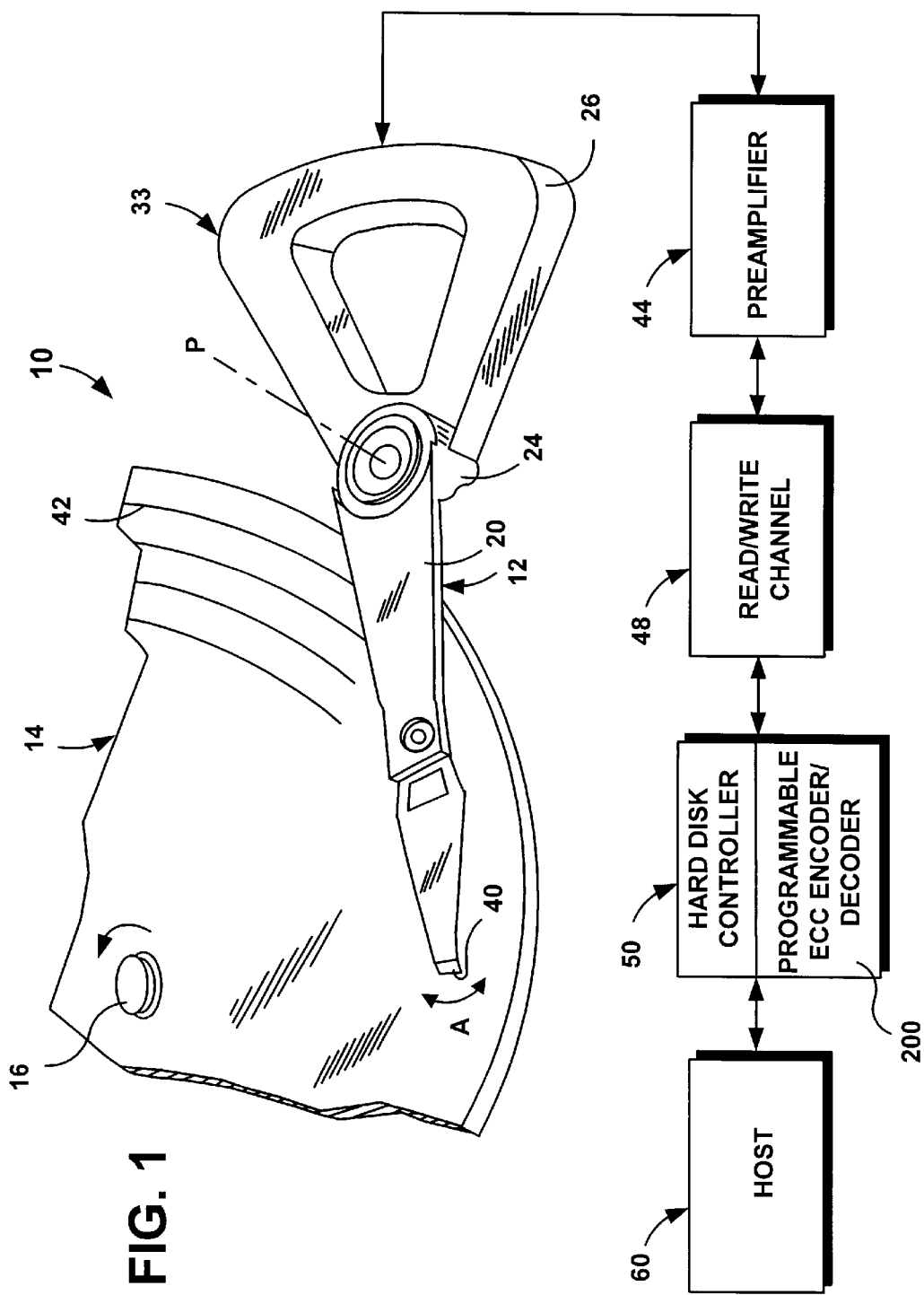
FIG. 1 is a schematic illustration of a data storage system such as a disk drive, that implements a programmable ECC track layout algorithm to optimize error correction redundancy according to the present invention.

FIG. 1 illustrates a disk drive 10 comprised of a head stack assembly 12 and a stack of spaced apart magnetic, optical and/or MO data storage disks or media 14 that are rotatable about a common shaft 16. The head stack assembly 12 includes a number of actuator arms 20 that extend into spacings between the disks 14, with only one disk 14 and one actuator arm 20 being illustrated for simplicity of illustration. The disk drive 10 further includes a preamplifier 44, a read/write channel 48, and a hard disk controller 50 that includes a soft error correction algebraic decoder 200 of the present invention.

The head stack assembly 12 also includes an E-shaped block 24 and a magnetic rotor 26 attached to the block 24 in a position diametrically opposite to the actuator arms 20. The rotor 26 cooperates with a stator (not shown) for the actuator arms 20 to rotate in a substantially radial direction, along an arcuate path in the direction of an arrow A. Energizing a coil of the rotor 26 with a direct current in one polarity or the reverse polarity causes the head stack assembly 12, including the actuator arms 20, to rotate around axis P in a direction substantially radial to the disks 14. A head disk assembly 33 is comprised of the disks 14 and the head stack assemblies 12.

A transducer head 40 is mounted on the free end of each actuator arm 20 for pivotal movement around axis P. The magnetic rotor 26 controls the movement of the head 40 in a radial direction, in order to position the head 40 in registration with data information tracks or data cylinders 42 to be followed, and to access particular data sectors on these tracks 42.

Numerous tracks 42, each at a specific radial location, are arrayed in a concentric pattern in a magnetic medium of each surface of data disks 14. A data cylinder includes a set of corresponding data information tracks 42 for the data surfaces of the stacked disks 14. Data information tracks 42 include a plurality of segments or data sectors, each containing a predefined size of individual groups or sub-blocks (or sectors) of data records that are saved for later retrieval and updates. The data information tracks 42 can be disposed at predetermined positions relative to a servo reference index.

Figure 2:
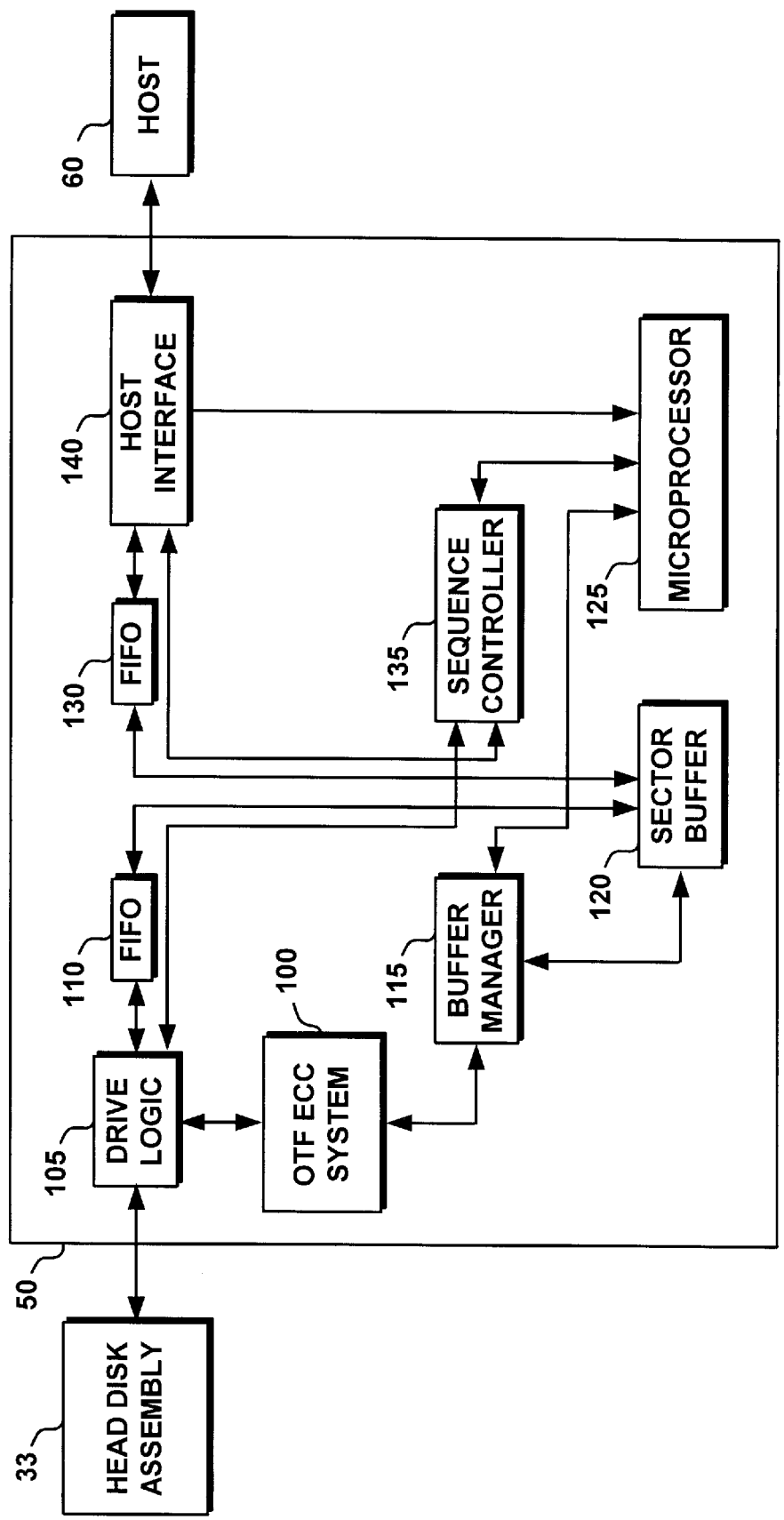
FIG. 2 is a block diagram detailing the architecture of a buffered hard disk controller that implements the programmable multi-level ECC track layout algorithm.

FIG. 2 illustrates an exemplary architecture of a buffered hard disk controller 50 that comprises an on-the-fly (OTF) error correction code (ECC) system 100 for implementing the on-the-fly error correction code according to the present invention. It should be clear that the present invention is not limited to this specific architecture and that it can be implemented by, or in conjunction with other architectures.

The hard drive controller 50 includes a logic drive circuit 105 that formats data from the hard disk assembly 33, for example from 8 bits to 32 bits. A FIFO register 110 stores the formatted data and exchanges the same with a sector buffer 120. The ECC system 100 receives the formatted data from the drive logic circuit 105 and performs the error correction coding algorithm of the present invention, as described herein.

A buffer manager 115 controls data traffic between the ECC system 100, a sector buffer (i.e., random access memory) 120, and a microprocessor 125. Another FIFO register 130 stores data and exchanges the same with the sector buffer 120. A sequence controller 135 is connected between the drive logic circuit 105, the microprocessor 125, and a host interface 140, to control the sequence operation of the data traffic and various commands across the hard drive controller 50. The host interface 140 provides an interface between the hard drive controller 50 and a host 60.

Figure 3:
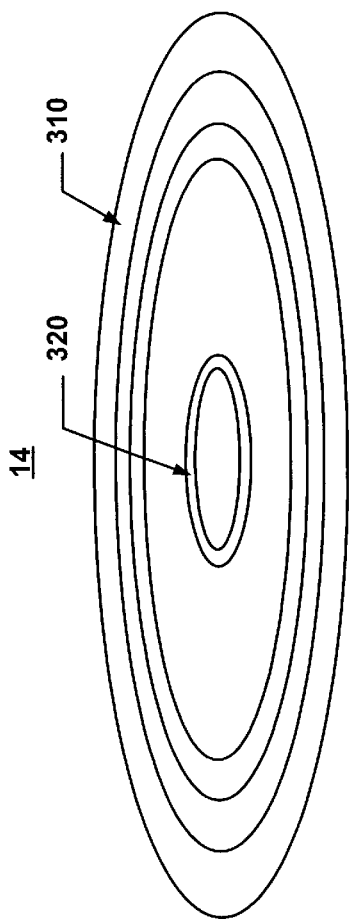
FIG. 3 is a schematic illustration of a data storage disk showing inner and outer tracks and zones, upon which the programmable multi-level ECC track layout algorithm is implemented.

FIG. 3 illustrates the segmentation of the disk 14 into outer zones 310 and inner zones 320. It is generally known that due to the annular geometry of the disk 14 and the radial nature of the disk formatting, coupled with the customary use of uniform bit densities, higher frequency writes are performed at the outer diameter (outer zones 310) than at the inner diameter (inner zones 320). Consequently, the probability for a read/write error is different for each zone and head of the disk 14. As used herein a zone is a band of contiguous concentric tracks or sectors.

For example, longer error bursts caused by thermal asperities or disk defects could be specific to one head or one disk 14 in a multiple disk stack. In addition, a distinction can be made between two error types. At the block level, at high areal densities, noise could act very much like the background noise floor, obeying a random distribution (i.e., Poisson distribution). The effect of this random noise is that at this lower level of the structure, the outer zone 310 will have equal probability to be affected and the error burst lengths are small.

However, empirical studies indicate that errors do not follow a random distribution across the entire surface of the disk 14. During manufacturing tests of the disk drive's read/write capabilities, the head signal and disk noise are recorded, and a Signal to Noise Ratio (SNR) is evaluated. The number of sector level ECC check bytes, $2t_1$ required to correct for random noise is determined from this criterion, where $2t_1$ is a uniform number of check bytes for each sector across the disk surface.

Other tests such as Track Misregistration (TMR), Roloff Curve, and a thermal asperity (TA) scan are performed.

Input parameters are determined from multiple manufacturing tests data and are represented by statistical distribution of track misregistrations correlating to the deviations of individual sub-blocks (or sectors) from random distribution. Wherefore, an important goal of the present invention is to provide an analytical model that approximates these deviations, so as to reduce the number of error correction bytes required to effect the ECC.

Figure 4:
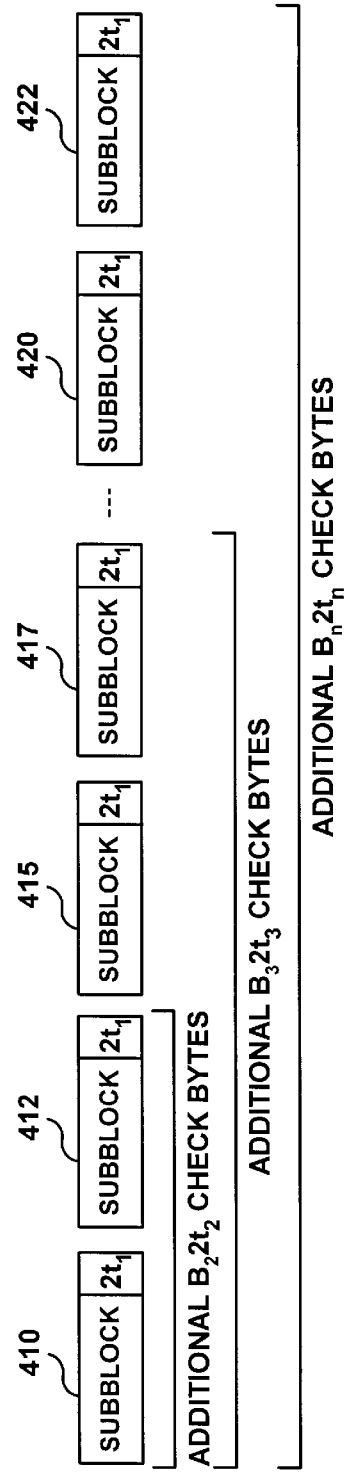
FIG. 4 is a block diagram of a few adaptively written sub-blocks of the disk surface, illustrating the number of check bytes required to account for the deviation of the byte errors (i.e., Charlier Polynomial fit) from the random distribution (i.e., Poisson distribution), as further illustrated in the graph of FIG. 7.

To this end, and with further reference to FIG. 4, the programmable ECC encoder/decoder 200 (FIG. 1) that implements the programmable (or adaptive) ECC algorithm of the present invention, assigns additional $B_2 2 t_2$ check bytes for second level correction in $B_2$ sub-blocks. Furthermore, the programmable multi-level ECC algorithm assigns additional $B_3 2 t_3$ check bytes for third-level correction in $B_3$ sub-blocks, and so forth.

The end result of this programmable multi-level ECC check bytes assignment is to determine the Hamming distance distribution or profile for each head/zone combination of the disk drive. The Hamming distance Profile is used as an input to the Multi-level Error Correction Code defined by the following expression:

$$\{t_1,[B_k,t_k]\},$$

where k varies between 2 and n; where $B_k$ denotes a number of sub-blocks, and where $t_k$ represents the additional number of corrections given to these sub-blocks.

Figure 5:
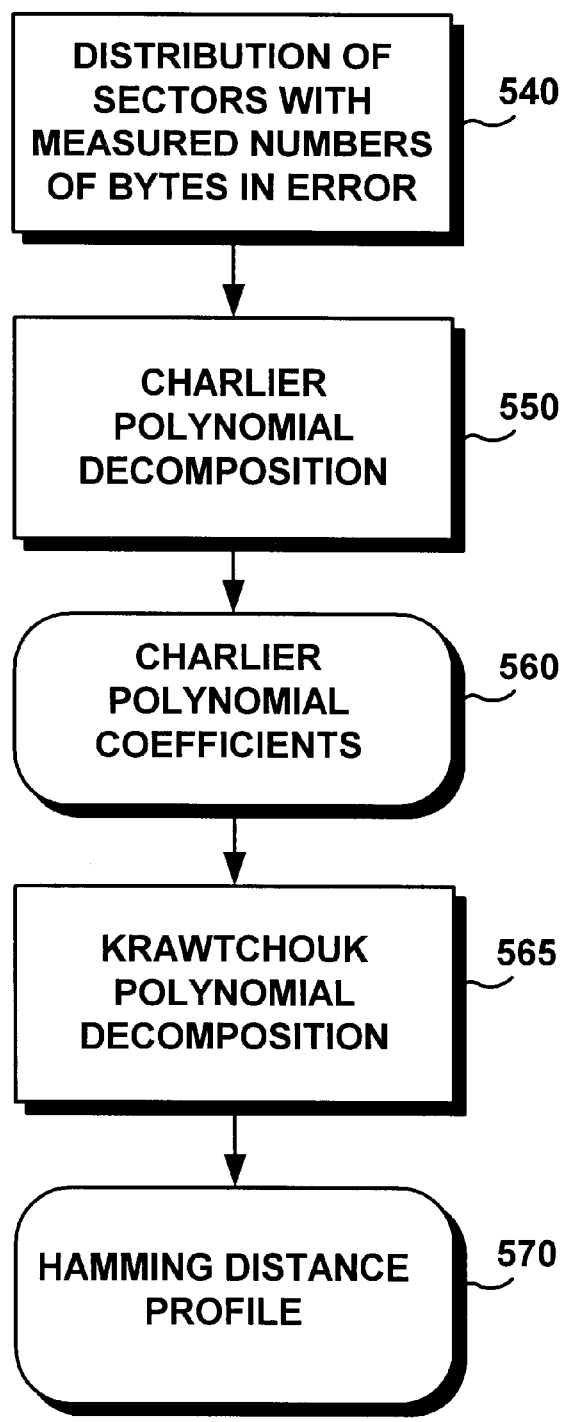
FIG. 5 is a flow chart illustrating the algorithm for calculating the parameters of the programmable multi-level ECC scheme of the present invention.
Figure 6A:
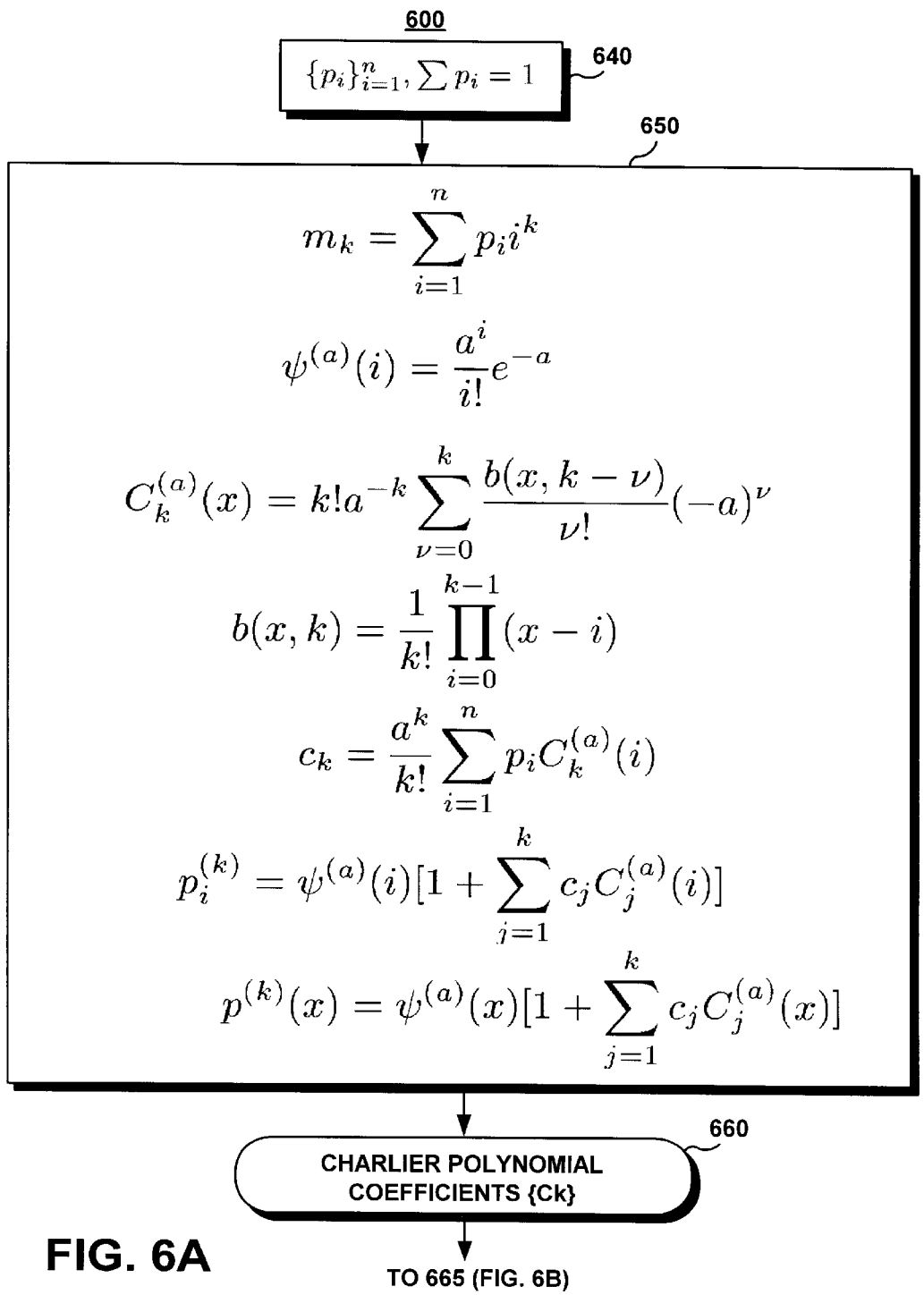
FIG. 6 is comprised of FIGS. 6A and 6B, and represents an exemplary implementation of a Charlier polynomial decomposition for use in the programmable multi-level ECC track layout algorithm of FIG. 5.
Figure 7:
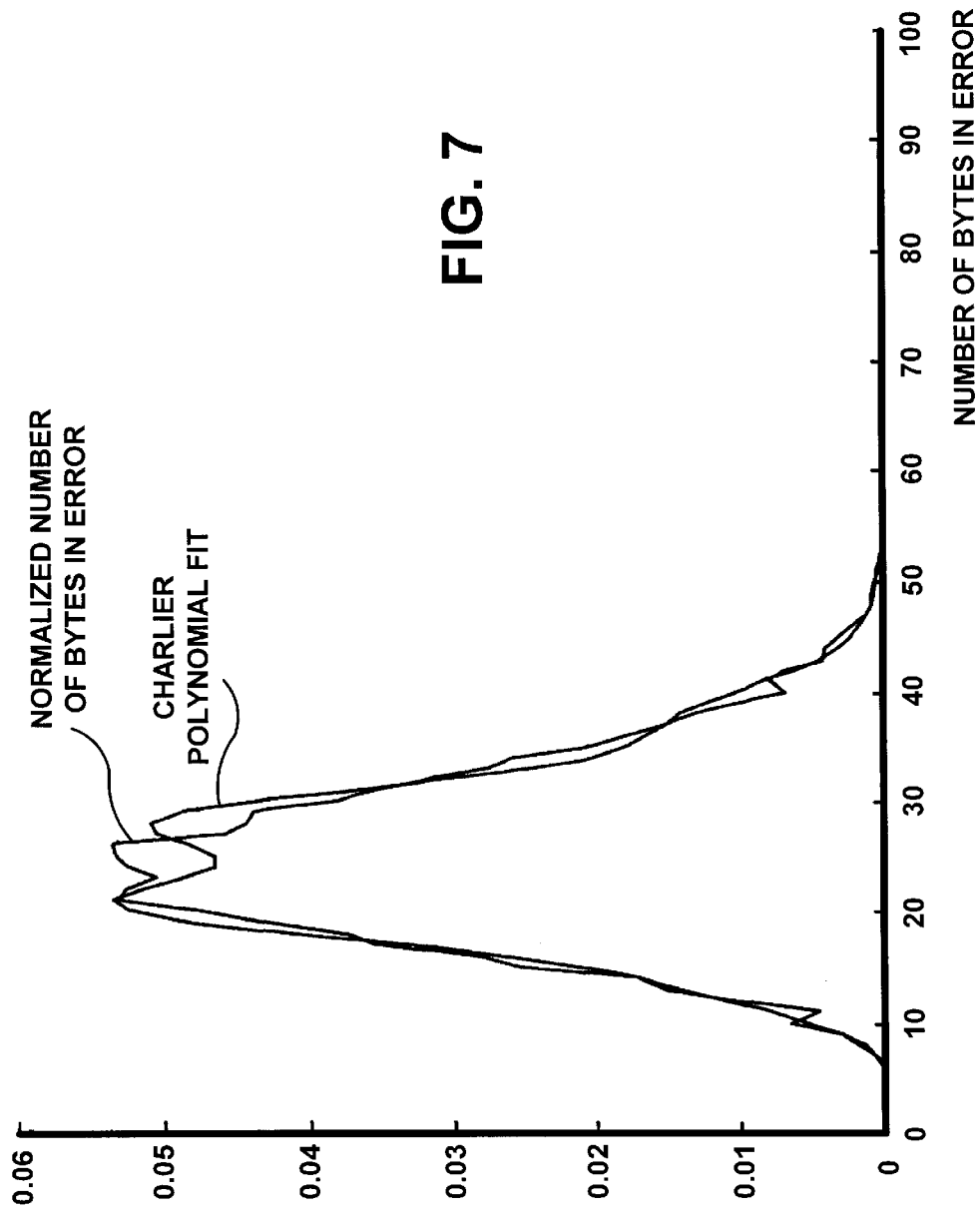
FIG. 7 represents exemplary graphical illustrations of a measured probability distribution for a sector having a specific number of in bytes in errors, compared to an analytical approximation (i.e., a Charlier polynomial fit) used in the programmable multi-level ECC track layout algorithm of FIG. 5 for each head/zone combination of the disk drive.

An exemplary block diagram of the programmable multi-level ECC algorithm or method 500 is represented in FIGS. 5 and 6. With reference to FIG. 5, the method 500 collects data about the distribution of sectors with measured numbers of bytes in error (step 540), for example in histogram formats. The histograms are represented at step 640 in FIG. 6 by the following numbers:

$$\{p_i\}_{i=1}^n, \sum p_i = 1$$

where $p_i$ is the probability of having "i" bytes in error in a sub-block (or sector), and n is the maximum number of errors.

Next, at step 550 of FIG. 5, the method 500 applies the Charlier polynomial decomposition, as illustrated at step 660 in FIG. 6, resulting in Charlier polynomials 560. The Charlier polynomial decomposition equations are as follows, as illustrated at step 650 of FIG. 6, where the k-th moment of probability distribution $(m_k)$ is provided by the following expression:

$$m_k = \sum_{i=1}^n p_i i^k$$

The Poisson distribution $\Psi^{(a)}(x)$ with parameter $a=m_1$ is provided by the following expression:

$$\psi^{(a)}(i) = \frac{a^i}{i!} e^{-a}$$

The k-th Charlier polynomial $C_k^a(x)$ used to calculate the deviation from the Poisson distribution $\Psi^{(a)}(x)$ is provided by the following equation:

$$C_k^{(a)}(x) = k! a^{-k} \sum_{v=0}^k \frac{b(x, k-v)}{v!} (-a)^v$$

where b(x, k) is a binomial polynomial and x and v are variables.

The binomial polynomial b(x, k) is expressed by the following equation:

$$b(x, k) = \frac{1}{k!} \prod_{i=0}^{k-1} (x - i)$$

and the k-th coefficient, $c_k$, in the Charlier polynomial expansion is expressed by the following equation:

$$c_k = \frac{d^k}{k!} \sum_{i=1}^n p_i C_k^{(a)}(i)$$

The k-approximation to the probability $p_i$, $p_i^{(k)}$, is expressed by the following equation:

$$p_i^{(k)} = \psi^{(a)}(i) \left[ 1 + \sum_{j=1}^k c_j C_j^{(a)}(i) \right]$$

The k polynomial approximation to the probability distribution is expressed by the following equation:

$$p^{(k)}(x) = \psi^{(a)}(x) \left[ 1 + \sum_{j=1}^k c_j C_j^{(a)}(x) \right]$$

Accounting for the Charlier polynomial coefficients $\{C_k\}$ that have been derived from the Charlier polynomials 650, and referenced by the numeral 660 in FIG. 6, the method 500 of FIG. 5 applies the Krawtchouk polynomial decomposition to the Charlier polynomial at step 565 (FIG. 5), as represented by the following equation at step 665 in FIG. 6:

$$P_n^{(q)} = \sum_{v=0}^n (-q)^v (q-1)^{n-v} \binom{N-v}{n-v} \binom{x}{v}$$

The foregoing equation defines a polynomial for a finite field of size (q) and a codeword of length (N) including symbols from the q-ary alphabet.

The following equation provides the translation of the Charlier polynomials into Krawtchouk polynomials:

$$P_n^{(q)}(x; N) = \sum_{m=0}^n c_m(n) C_m^{(a)}(x)$$

using the connection coefficient recurrence $\{c_m(n)\}_{m=1}^n$, as expressed by the following equation:

$(n-m+1)c_{m-1}(n)+m(q+a(2m-n-N-1))c_m(n)+a^2 m(m+1)(N-m)c_{m+1}(n)=0,$ with the following initial conditions:

$C_{n+1}(n)=0, C_n(n)=1.$

This results in a new Krawtchouk polynomial expansion, $\alpha(x)$, expressed by the following equation:

$$\alpha(x) = \sum_{i=0}^{n} \alpha_i P_i^{(q)}(x)$$

The foregoing polynomial can be viewed as the annihilator polynomial of the multi-level ECC scheme with a Hamming distance distribution $\{d_1, d_2, d_3, \ldots d_n\}$, as expressed by the following equation:

$$\alpha(x) = M \prod_{i=1}^{n} \left(1 - \frac{x}{d_i}\right)$$

where $d_i$'s represent the Hamming distances, and M is the sum of the codewords $B_i$, as illustrated by the following equation and Table I that shows the correspondence between the codewords and the Hamming distances:

$$M = B_1 + B_2 + B_3 + \ldots B_n.$$

TABLE I

| Codeword | Corresponds to | Hamming Distance |
|---|---|---|
| $B_1$ | → | $2t_1 + 1 = d_1$ |
| $B_2$ | → | $2t_2 + 1 = d_2$ |
| ... | | |
| $B_n$ | → | $2t_n + 1 = d_n$ |

The application of the Krawtchouk polynomial decomposition at step 565 results in a Hamming distance profile 570 (FIG. 5), as further illustrated by the following equation at step 670 (FIG. 6):

HD Distribution: $\{(d_1, B_1), (d_2, B_2), (d_3, B_3) \ldots, (d_n, B_n)\}$, where "HD Distribution" refers to the Hamming distance distribution of the multi-level ECC scheme, and $[d_i = 2t_i + 1]$ for "i" varying between the values 1 and n.

It is to be understood that the specific embodiments of the invention that have been described are merely illustrative of certain application of the principle of the present invention. Numerous modifications may be made to the programmable multi-level ECC algorithm and system described herein, without departing from the spirit and scope of the present invention. Moreover, while the present invention is described for illustration purpose only in relation to a data storage system, it should be clear that the invention is applicable as well to various communications and data processing systems. In addition, the programmable multi-level ECC system can be saved on a suitable storage medium such as a diskette, a CD, a hard drive, or like devices.

What is claimed is:

1. A programmable multi-level error correction method, comprising:
   modeling a probability distribution as a first polynomial having a basis;
   converting the first polynomial to a second polynomial having a different basis; and
   defining a Hamming distance distribution from the second polynomial.

2. The method of claim 1, wherein modeling the probability distribution includes modeling as a Charlier polynomial.

3. The method of claim 2, wherein converting to the second polynomial includes converting to a Krawtchouck polynomial.

4. The method of claim 3, further including optimizing error correction redundancy in a data storage medium by assigning additional $B_n 2t_n$ check bytes to $B_n$ sectors.

5. The method of claim 4, wherein defining a Hamming distance distribution includes profiling the Hamming distance according to the following expression:

$$\{t_1, [B_k, t_k]\},$$

where k varies between 2 and a predefined value; where $B_k$ denotes a number of sub-blocks; and where $t_k$ represents an additional number of corrections given to this number of sub-blocks.

6. The method of claim 5, wherein the step of converting includes using connection coefficients that are calculated recursively.

7. The method of claim 1, wherein converting to the second polynomial includes converting to a Krawtchouck polynomial.

8. A programmable multi-level error correction system, comprising:
   an encoder/decoder that performs the following functions:
   modeling a probability distribution as a first polynomial having a basis;
   converting the first polynomial to a second polynomial having a different basis, and
   defining a Hamming distance distribution from the second polynomial.

9. The system of claim 8, wherein the encoder/decoder models the probability distribution by modeling as a Charlier polynomial.

10. The system of claim 9, wherein the encoder/decoder converts to the second polynomial by converting to a Krawtchouck polynomial.

11. The system of claim 10, wherein the encoder/decoder further optimizes error correction redundancy in a data storage medium by assigning additional $B_n 2t_n$ check bytes for each pair of contiguous sectors.

12. The system of claim 11, wherein the encoder/decoder defines a Hamming distance distribution by profiling the Hamming distance according to the following expression:

$$\{t_1, [B_k, t_k]\},$$

where k varies between 2 and a predefined value; where $B_k$ denotes a number of sub-blocks, and where $t_k$ represents an additional number of corrections given to this number of sub-blocks.

13. The system of claim 12, wherein the encoder/decoder converts the first polynomial to the second polynomial by using connection coefficients that are calculated recursively.

14. The system of claim 8, wherein the encoder/decoder converts to the second polynomial by converting to a Krawtchouck polynomial.

* * * * *